United States Patent [19]
Ochiai

[11] Patent Number: 5,736,742
[45] Date of Patent: Apr. 7, 1998

[54] OBJECTIVE LENS AND CHARGED PARTICLE BEAM SYSTEM

[75] Inventor: Yukinori Ochiai, Tokyo, Japan

[73] Assignee: NEC Corporation, Japan

[21] Appl. No.: 729,670

[22] Filed: Oct. 3, 1996

[30] Foreign Application Priority Data

Oct. 5, 1995 [JP] Japan ................................ 7-258702

[51] Int. Cl.[6] ............................................ H01J 37/20
[52] U.S. Cl. ............................. 250/396 R; 250/492.2
[58] Field of Search ................... 250/396 R, 396 ML, 250/492.2, 492.1, 310, 311, 442.11

[56] References Cited

U.S. PATENT DOCUMENTS 3,526,766  9/1970  Riecke ........................ 250/442.11
5,001,350  3/1991  Ohi et al. ..................... 250/440.11
5,004,919  4/1991  Kondo .......................... 250/311
5,264,705  11/1993  Honda et al. ............... 250/442.11

Primary Examiner—Kiet T. Nguyen
Attorney, Agent, or Firm—Hayes, Soloway, Hennessey, Grossman & Hage, P.C.

[57] ABSTRACT

An in-lens type objective lens is separated into two parts along the plane perpendicular to the direction of electron or ion orbit, so that a target sample can placed between the upper part and the lower part of the lens. Coils for the two parts are serially connected so as to work as one coil. Each of the upper and lower parts of the lens is provided with a lens positioning device. If the in-lens type objective lens is of a three-piece electrostatic type, a structure is provided which enables a target sample to be placed between a first and second electrode group and the third electrode.

8 Claims, 3 Drawing Sheets

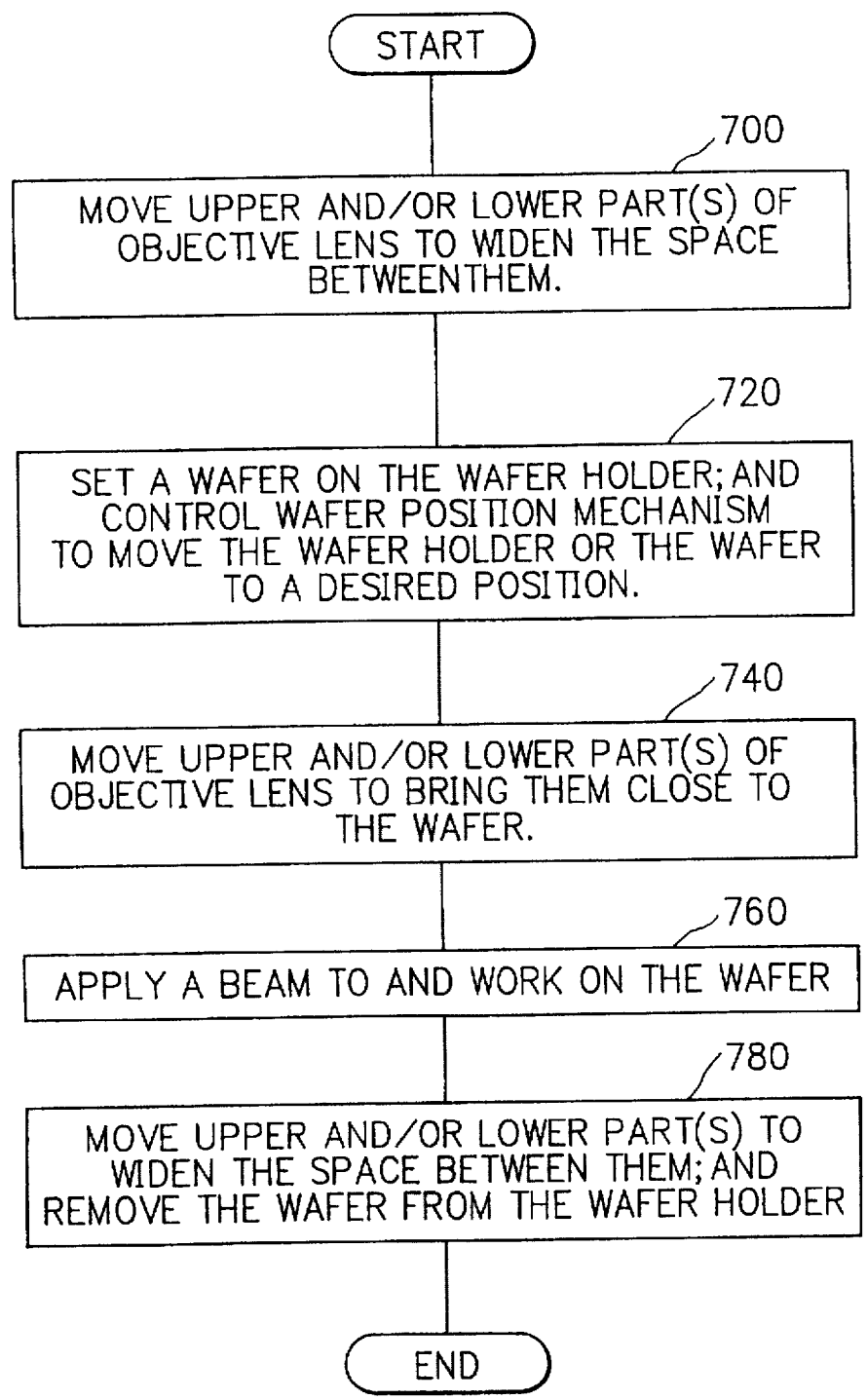

OBJECTIVE LENS AND CHARGED PARTICLE BEAM SYSTEM

BACKGROUND OF THE INVENTION

The present invention generally relates to an objective lens for focusing an electron beam or ion beam, which is used in exposing or direct-machining a micropattern for forming a microstructure electronic devices, micromechanics, etc., as well as in welding, melting, fusing, or marking with an electron beam.

DESCRIPTION OF THE RELATED ART

An objective lens for obtaining a beam with a fine iris is installed in a conventional observing or pattern forming machine which uses an electron beam or an ion beam. Usually, a magnetic-type objective lens is used for focusing an electron beam, and an electrostatic-type objective lens is used for focusing an ion beam. Since an electron has a large ratio of mass to charge, that is, a large specific charge, and a high velocity for a given energy, its orbit deflected accurately in a magnetic field.

Furthermore, in a magnetic lens, a magnetic field generating coil can be disposed on the side of atmospheric air. The magnetic lens, which is easy to fabricate and maintain, is used to deflect electrons. Since an ion has a small specific charge and a low velocity when given the same energy, compared with the electron, an electric-field lens which uses an electric field is generally used to efficiently deflect an orbit of ions.

FIG. 1 shows the structure of a conventional electron beam or ion beam lithography system. An electron or ion gun 1 is driven by a power supply 16, and a extracting voltage is applied to the electron or ion gun 1, which emits electrons or ions. The electron or ion beam 4 emitted from the electron gun or ion gun 1 is focused through a focusing lens 3. The beam 4 is deflected by a blanking electrode 5 with a voltage supplied by a blanking power supply 7, and, if necessary, blocked by a blanking aperture 6. The blanking power supply 7 is controlled by a controller 10. The beam which has passed through the blanking aperture 6 is supplied with power by the deflecting power supply 8 and is deflected. The beam is focused by an objective lens 23, on a sample 11. The objective lens 23 has a plane of incidence and a plane of outgoing. Sample 11 is positioned outside the plane of outgoing of the objective lens 23.

Generally, the distance between the center part or lower end of a lens and a sample is called the "working distance" and the sample is conventionally placed outside the objective lens. For this reason, there is a structural limit to reduce the working distance while obtaining a microbeam.

In order to reduce the working distance and obtain a microbeam, the prior art employs an in-lens-type lens, wherein a sample is put inside the structure of a lens, for use in an electronic microscope. Prior art 2 shows an example of an in-lens-type objective lens. In FIG. 2, the in-lens-type objective lens comprises a power supply 14, a pole piece 20, a coil 21 and a cooling water pipe 22. In a in-lens of FIG 2 type lens, reference numeral 4 indicates an ion beam. A sample is placed where a magnetic field or electric field constituting the lens is distributed.

However, a conventional in-lens-type lens permits a reduced working distance but puts a limitation on the size of a sample to be inserted. If the diameter of a wafer used in an electronic device is changed from 6 inches to 12 inches for example, a conventional lens will not be able to accommodate a wafer with such a large diameter. Thus, there is a problem in the prior art that the conventional objective lens cannot cope with a large-size wafer. Moreover, large-size wafers are being chosen for mass production and cost reduction.

SUMMARY OF THE INVENTION

It is therefore an object of the invention to provide an in-lens type objective lens which substantially eliminates the limitation of size of a target sample.

According to the present invention, an in-lens type objective lens is separated into two parts along the plane perpendicular to the direction of electron or ion orbit, so that a target sample can be placed between the upper part and the lower part of the lens. Coils for the two parts are serially connected so as to work as one coil.

Each of the upper and lower parts of the lens is provided with a lens positioning device.

In one embodiment of the present invention, in-lens type objective lens is a three-piece electrostatic type which has three electrodes, and a structure is provided which enables a target sample to be placed between a first and second electrode group and the electrode.

The above described objective lenses are especially suitable to charged particle beam exposure or lithography systems.

As described above, an in-lens type objective lens according to the invention not only permits the working distance to be reduced but also permits a large-sized sample to be used.

BRIEF DESCRIPTION OF THE DRAWINGS

The objects, features and advantages of the present invention will become more apparent from consideration of the following detailed description, in conjunction with the accompanying drawings, in which:

FIG. 7 is a flow chart showing procedures for setting a sample or wafer in the objective lens according to the present invention.

DESCRIPTION OF THE PREFERRED EMBODIMENTS

Figure 1:
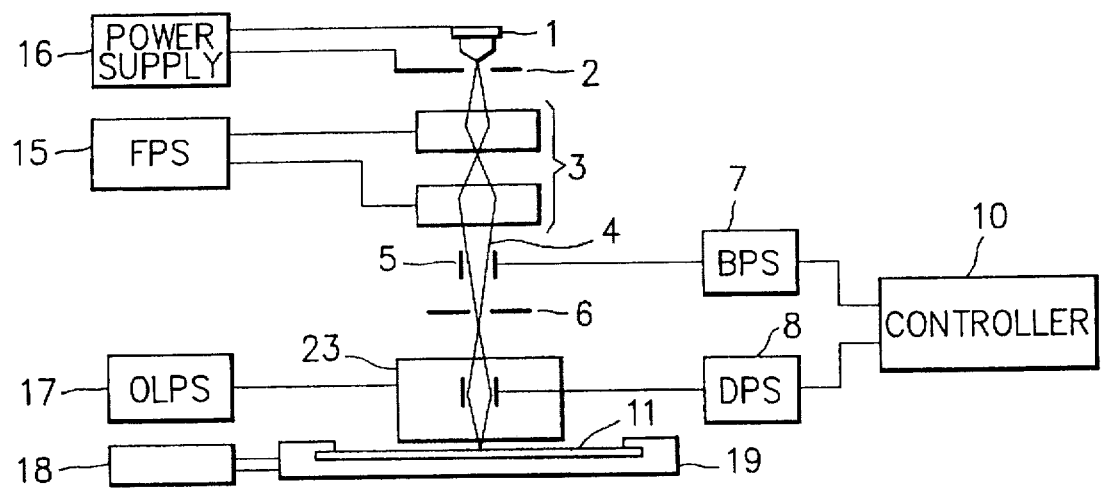
FIG. 1, is a schematic diagram showing an example of a conventional electron beam or ion beam lithography system.
Figure 2:
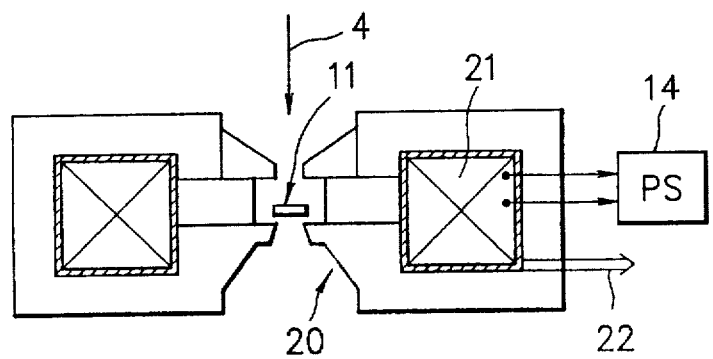
FIG. 2 is a diagram showing an example of a conventional in-lens-type objective lens.
Figure 3:
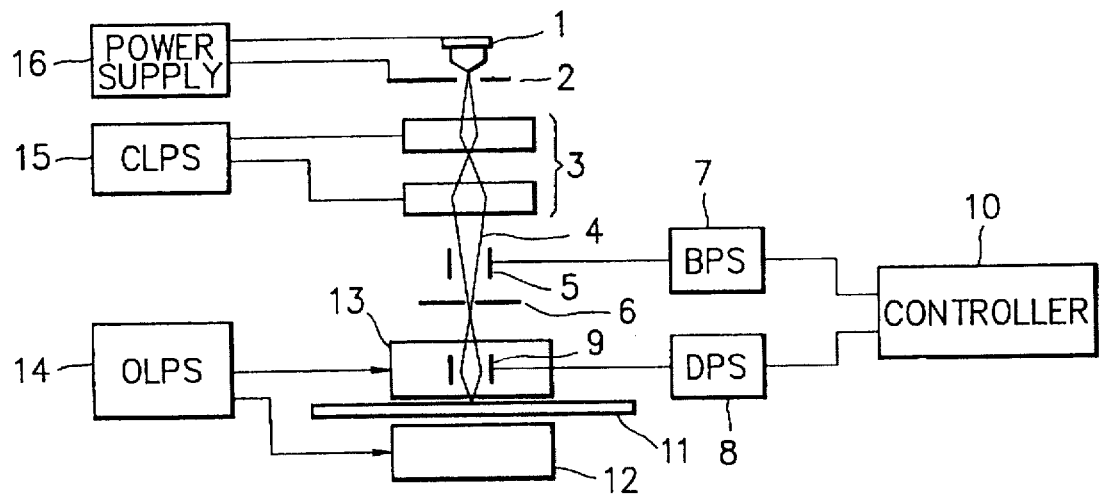
FIG. 3 is a diagram showing an arrangement of an exemplary electron beam or ion beam lithography system incorporating an in-lens type objective lens according to the present invention.

FIG. 3 shows an arrangement of an exemplary electron beam or ion beam lithography system incorporating an in-lens type magnetic objective lens according to the present invention. In FIG. 3, the objective lens comprises an electron or ion source 1, an extracting electrode 2, converging lenses 3, an electron or ion beam 4, a blanking electrode 5, a blanking aperture 6, a blanking power supply (BPS) 7 for supplying a blanking voltage to the blanking electrode 5, a deflecting power supply (DPS) 8, a deflector 9, a controller 10, a sample (e.g., a wafer) 11, an objective lens lower part 12, an objective lens upper part 13, a objective lens power supper (OLPS) 14 for supply a voltage to the objective lens, a converging lens power supply (CLPS) 15, and a power supply 16 for supplying voltages to the electron or ion source 1 and the extracting electrode 2.

The electron or ion gun 1 is driven by a power supply 16, and an extracting voltage is applied to the extracting electrode 2 so as to emit electrons or ions. The electron or ion beam 4 emitted from the electron or ion gun 1 is focused through the converging lens 3. The beam is deflected by the blanking electrode 5 with a voltage which is supplied by the blanking power supply (BPS) 7 and blocked by the blanking aperture 6. The blanking power supply (BPS) 7 is controlled by the controller 10. The beam which has passed through the blanking aperture 6 is deflected by a deflecting electrode 9.

A voltage is applied to the deflecting electrode 9 by the deflecting power supply (DPS) 8 which is controlled by the controller 10. The beam is focused on the sample 11 by the objective lenses 12 and 13, which is supplied with a voltage from the objective lens power supply (OLPS) 14.

An objective lens is divided into the upper part and lower part of the objective lens. Since a sample is inserted between these parts, there is no limit to the sample size.

Figure 4:
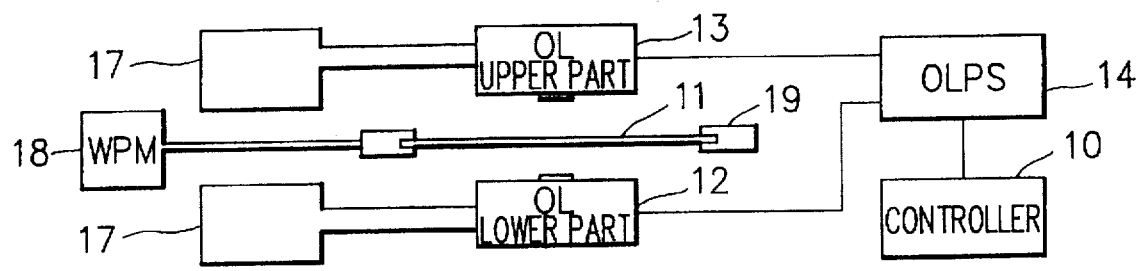
FIG. 4 is a schematic diagram showing an illustrative embodiment of a movable in-lens type objective lens according to the present invention.

FIG. 4 shows an illustrative embodiment of a movable in-lens type objective lens used in the electron beam or ion beam lithography system of FIG. 3. In FIG. 4, the movable in-lens-type objective lens further comprises two independent objective lens positioning mechanisms 17 which are independently movable to position the upper part (13) and the lower part (12) of the objective lens separately, wafer positioning mechanism 18 which is movable to position the wafer 11 supported by a wafer holder 19.

FIG. 7 is a flow chart showing procedures for setting a sample or wafer in the objective lens according to the present invention. A wafer 11 itself has generally a thickness of 1 mm or less, but the thickness of a jig for fixing the wafer 11 may be greater than that of the wafer 11. In order to form a microbeam, the wafer 11 is preferably put as closely as possible to the objective lenses 12 and 18. Thus, according to the present invention, the space between the objective lenses 12 and 13 is widened before setting of the sample 11 as shown in Step 700 in FIG. 7. In step 720, the sample 11 is set on the wafer holder 19, and the wafer positioning mechanism 18 is controlled to move the wafer holder 19 or the wafer to a desired position. Before applying a beam to the wafer, the upper part 13 and/or the lower part 12 of the objective lens are moved as closely as possible to the wafer 11 in step 740. An electron or ion beam is applied to the wafer 11 in working on the wafer 11 in step 760. Then, the upper 13 and/or lower 12 parts of the objective lens are moved to widen the space between the two parts to remove the wafer 11 from the wafer holder 19 in step 780. In this manner, the present invention can provide an objective lens which is not limited by the structure of the supporting mechanism of the wafer 11.

Figure 5:
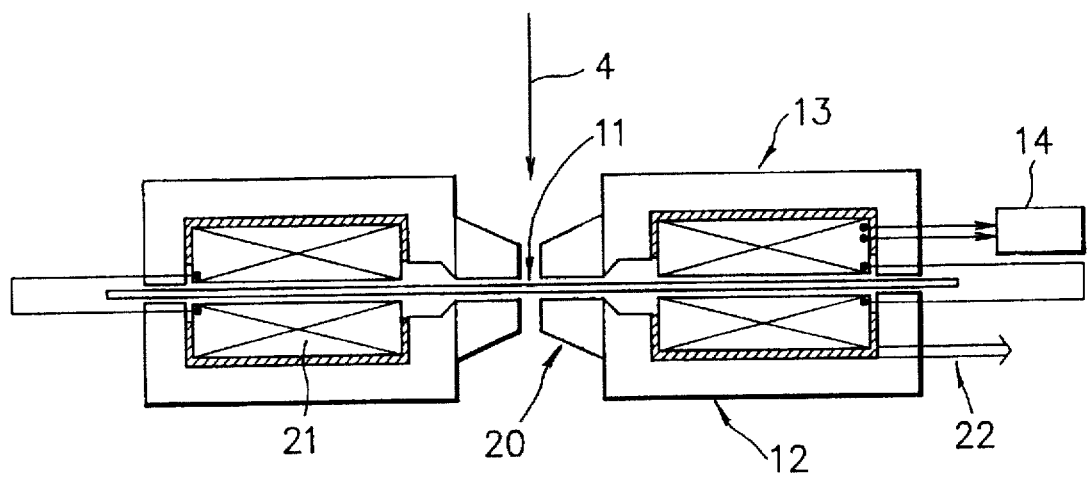
FIG. 5 is a cross section, taken along the vertical plane containing a focus of the lens, of the movable in-lens type objective lens in which a sample are set ready for observation or working.

FIG. 5 shows a cross section, taken along the vertical plane containing a focus of the lens, of the movable in-lens type magnetic objective lens in which samples are set ready for observation or working. In FIG. 5, though the objective lens is divided into two parts and accordingly the coil of the lens is also divided into the lower and upper parts (12 and 13), the lower and the upper parts of the coil are so arranged that the same current from the objective lens power supply 14 flows through the two parts. Also, a material with high permeability is preferably used so that a leakage in the magnetic field made as is made as minimized. The lens electrode is preferably designed so that the magnetic field strength is strengthened around the sample or wafer and the field strain is decreased.

The upper and lower coils for generating the magnetic field of a magnetic lens is wired to form a single coil. Further, the magnetic lens is so arranged that the center part of the lens will not be moved when the magnetic field strength is changed. The size of facing pole pieces is preferably made as large as possible so that unnecessary strains cannot be generated in the magnetic field distribution across the sample.

Figure 6:
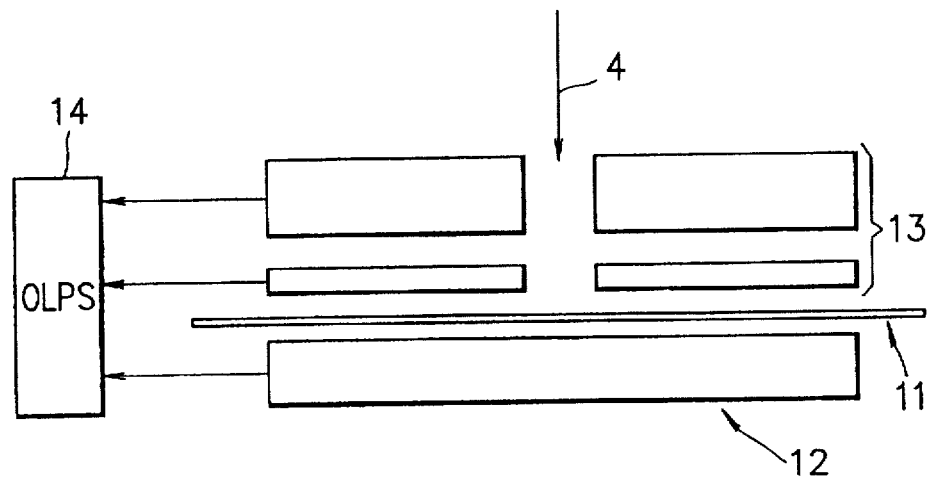
FIG. 6 is a diagram schematically showing an illustrative embodiment of an in-lens type electrostatic objective lens according to the present invention.

FIG. 6 schematically shows an illustrative embodiment of an in-lens type electrostatic objective lens according to the present invention. The electrostatic objective lens is an example of a three piece electrostatic lens. In FIG. 6, the lens comprises an upper electrode group 13 comprising the first and the second electrode, a lower electrode 12 or the third electrode, and an objective lens power supply 14. A sample 11 is inserted between the upper electrode group 13 and the third electrode 12 of the electrostatic lens. Since no electron or ion passes through the third electrode, it need not be holed.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A lens assembly for use in a charged particle beam lithography system comprising an objective lens divided substantially perpendicularly to a beam direction into an upper part and a lower part; and a semiconductor wafer inserted between said upper and lower parts.

2. A lens assembly as defined in claim 1, wherein said upper and lower parts further comprising an objective lens positioning mechanism which can move each said upper and lower parts to a desired position.

3. A lens assembly as defined in claim 1, wherein said objective lens is a three piece electrostatic objective lens comprising three electrodes; and said upper part comprises the top two electrodes of said electrostatic objective lens, and said lower part comprises the bottom electrode of said electrostatic objective lens.

4. A lens assembly as claimed in claim 1, wherein said objective lens comprises an in-lens type objective lens.

5. A lens assembly as claimed in claim 1, wherein said objective lens comprises an in-lens type magnetic objective lens.

6. A method of setting a sample in an objective lens assembly, comprising the steps of:

moving an upper part and/or a lower part of an objective lens to widen a space between said upper part and said lower part;

positioning a semiconductor wafer to a desired position in said objective lens; and closing said upper part and/or said lower part around said semiconductor wafer.

7. A method of setting a semiconductor wafer in a three piece electrostatic objective lens, comprising the steps of:

moving the upper two electrodes of an electrostatic objective lens and/or a lower electrodes of said electrostatic objective lens to widen a space between said upper and lower electrodes;

positioning a semiconductor wafer to a desired position in said space between said electrodes; and closing said upper electrodes and/or lower electrode around said semiconductor wafer.

8. A method as claimed in claim 7, further comprising the steps of:

moving said upper and lower electrodes with a lens positioning mechanism which can move said upper and lower electrodes to a desired position.

* * * * *